United States Patent
Shao et al.

(10) Patent No.: US 12,394,595 B2
(45) Date of Patent: Aug. 19, 2025

(54) MULTI-ANTENNA UNIT FOR LARGE AREA INDUCTIVELY COUPLED PLASMA PROCESSING APPARATUS

(71) Applicant: Applied Materials, Inc., Santa Clara, CA (US)

(72) Inventors: Shouqian Shao, Fremont, CA (US); Tae Kyung Won, San Jose, CA (US); Chien-Teh Kao, Sunnyvale, CA (US); Jianhua Zhou, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 484 days.

(21) Appl. No.: 17/987,259

(22) Filed: Nov. 15, 2022

(65) Prior Publication Data
US 2023/0162948 A1 May 25, 2023

Related U.S. Application Data

(60) Provisional application No. 63/282,341, filed on Nov. 23, 2021.

(51) Int. Cl.
*H01J 37/32* (2006.01)

(52) U.S. Cl.
CPC .............. *H01J 37/32119* (2013.01)

(58) Field of Classification Search
CPC ........................... H01J 37/321–32119
See application file for complete search history.

(56) References Cited

U.S. PATENT DOCUMENTS

| | | | | |
|---|---|---|---|---|
| 5,589,737 A | * | 12/1996 | Barnes | H01J 37/3222 219/121.52 |
| 6,028,395 A | * | 2/2000 | Holland | H01J 37/321 315/111.21 |
| 2015/0068682 A1 | | 3/2015 | Banna et al. | |
| 2015/0155139 A1 | | 6/2015 | Yoshikawa et al. | |
| 2017/0243725 A1 | * | 8/2017 | Yamazaki | H01J 37/32449 |
| 2017/0323769 A1 | | 11/2017 | Cho | |
| 2019/0214233 A1 | | 7/2019 | Jo et al. | |
| 2020/0194233 A1 | * | 6/2020 | Kao | H01L 21/02274 |

FOREIGN PATENT DOCUMENTS

WO 2021194935 A1 9/2021

OTHER PUBLICATIONS

PCT International Search Report and Written Opinion dated Apr. 3, 2023, for International Application No. PCT/US2022/049912.

* cited by examiner

*Primary Examiner* — Benjamin Kendall
(74) *Attorney, Agent, or Firm* — Patterson + Sheridan, LLP

(57) ABSTRACT

Embodiments of the present disclosure generally relate to a lid suitable for use in a semiconductor processing chamber. The lid includes a plurality of dielectric windows coupled to a perforated faceplate. The lid also includes a plurality of support members coupled to the perforated faceplate and positioned between adjacent dielectric windows. The lid further includes a plurality inductive couplers. One or more of the inductive couplers includes a first lower portion, a second lower portion, and a bridge. The bridge is disposed over at least one of the plurality of support members. The first lower portion is positioned on a first dielectric window of the plurality of dielectric windows. The second lower portion is positioned on a second dielectric window of the plurality of dielectric windows. The second dielectric window is adjacent to the first dielectric window.

20 Claims, 7 Drawing Sheets

MULTI-ANTENNA UNIT FOR LARGE AREA INDUCTIVELY COUPLED PLASMA PROCESSING APPARATUS

CROSS-REFERENCE TO RELATED APPLICATIONS

This application claims benefit of U.S. provisional patent application Ser. No. 63/282,341, filed Nov. 23, 2021, which is herein incorporated by reference.

BACKGROUND

Field

Embodiments of the present disclosure generally relate to process chambers, such as high density plasma (HDP) chambers used in semiconductor manufacturing. More particularly, embodiments of the present disclosure relate to antenna configurations for process chambers

Description of the Related Art

In the manufacture of solar panels or flat panel displays, many processes are employed to deposit thin films on substrates, such as semiconductor substrates, solar panel substrates, and liquid crystal display (LCD) and/or organic light emitting diode (OLED) substrates, to form electronic devices thereon. The deposition is generally accomplished by introducing a precursor gas into a chamber having a substrate disposed on a temperature controlled substrate support. The precursor gas is typically directed through a gas distribution assembly disposed above the substrate support. The precursor gas in the chamber is energized (e.g., excited) into a plasma by applying a single or array of radio frequency (RF) antennas inductively coupled to the precursor gas to form the plasma. The excited gas reacts to form a layer of material on a surface of the substrate that is positioned on the temperature controlled substrate support.

The size of the substrates for forming the electronic devices exceeds one square meter in surface area. Uniformity in film thickness across these substrates is difficult to achieve. Power applied to generate plasma within the process chamber can generate eddy currents which negatively affect plasma uniformity, and thus, deposition uniformity, and may also create other hardware issues such as, but not limited to, arcing and RF power loss.

Therefore, there is a need for methods and apparatuses for generating more uniform plasmas and/or reducing other hardware issues.

SUMMARY

The present disclosure generally relates to inductive coupler arrangements for use in processing chambers, such as those suitable for use in semiconductor manufacturing. The present disclosure also generally relates to lids and processing chambers having inductive couplers.

In one example, a lid suitable for use in a semiconductor processing chamber. The lid includes a plurality of dielectric windows coupled to a perforated faceplate. The lid also includes a plurality of support members coupled to the perforated faceplate and positioned between adjacent dielectric windows. The lid further includes a plurality of inductive couplers comprising a first subset of inductive couplers and a second subset of inductive couplers. Each inductive coupler of the first subset of inductive couplers includes a first lower portion, a second lower portion, and a bridge. The bridge is disposed over at least one of the plurality of support members. The first lower portion is positioned on a first dielectric window of the plurality of dielectric windows. The second lower portion is positioned on a second dielectric window of the plurality of dielectric windows. The second dielectric window is adjacent to the first dielectric window.

In another example, a lid suitable for use in a semiconductor processing chamber. The lid includes a plurality of dielectric windows coupled to a perforated faceplate, and the plurality of dielectric windows have a first subset of dielectric windows and a second subset of dielectric windows. The lid further includes a plurality of support members coupled to the perforated faceplate and positioned between adjacent dielectric windows. The lid includes a plurality of inductive couplers comprising a first subset of inductive couplers and a second subset of inductive couplers. The first subset of inductive couplers are non-planar. The second subset of inductive couplers are planar. The first subset of dielectric windows have a portion of two inductive couplers of the first subset of inductive couplers positioned thereon. The second subset of dielectric windows have a portion of one inductive coupler of the first subset of inductive couplers and one inductive coupler of the second subset of inductive couplers positioned thereon.

In yet another example, a lid suitable for use in a semiconductor processing chamber. The lid includes a plurality of dielectric windows coupled to a perforated faceplate, where the plurality of dielectric windows includes a first subset of dielectric windows and a second subset of dielectric windows. The lid further includes a plurality of support members coupled to the perforated faceplate and positioned between adjacent dielectric windows. The lid includes a first subset of inductive couplers, where the inductive couplers include a first lower portion, a second lower portion, and a bridge. The lid further includes a second subset of inductive couplers, where the second subset of inductive couplers are planar. The first subset of dielectric windows each has a portion of two inductive couplers of the first subset of inductive couplers positioned thereon. The second subset of dielectric windows each has a portion of one inductive coupler of the first subset of inductive couplers and one inductive coupler of the second subset of inductive couplers positioned thereon. The bridge is disposed over at least one of the plurality of support members.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to inductive coupler arrangements for use in processing chambers, such as those suitable for use in semiconductor manufacturing. The present disclosure also generally relates to lids and processing chambers having inductive couplers. The inductive couplers of the present disclosure are arranged with respect to one another so that eddy currents generated by the adjacent inductive couplers are reduced, thus improving plasma uniformity.

In one example, a lid suitable for use in a semiconductor processing chamber comprises a plurality of dielectric windows, a plurality of support members positioned between adjacent dielectric windows, and a plurality inductive couplers positioned adjacent the dielectric window. Each dielectric window of the plurality of dielectric windows has at least a portion of two of the inductive couplers of the plurality of the inductive couplers positioned thereover.

Figure 1:
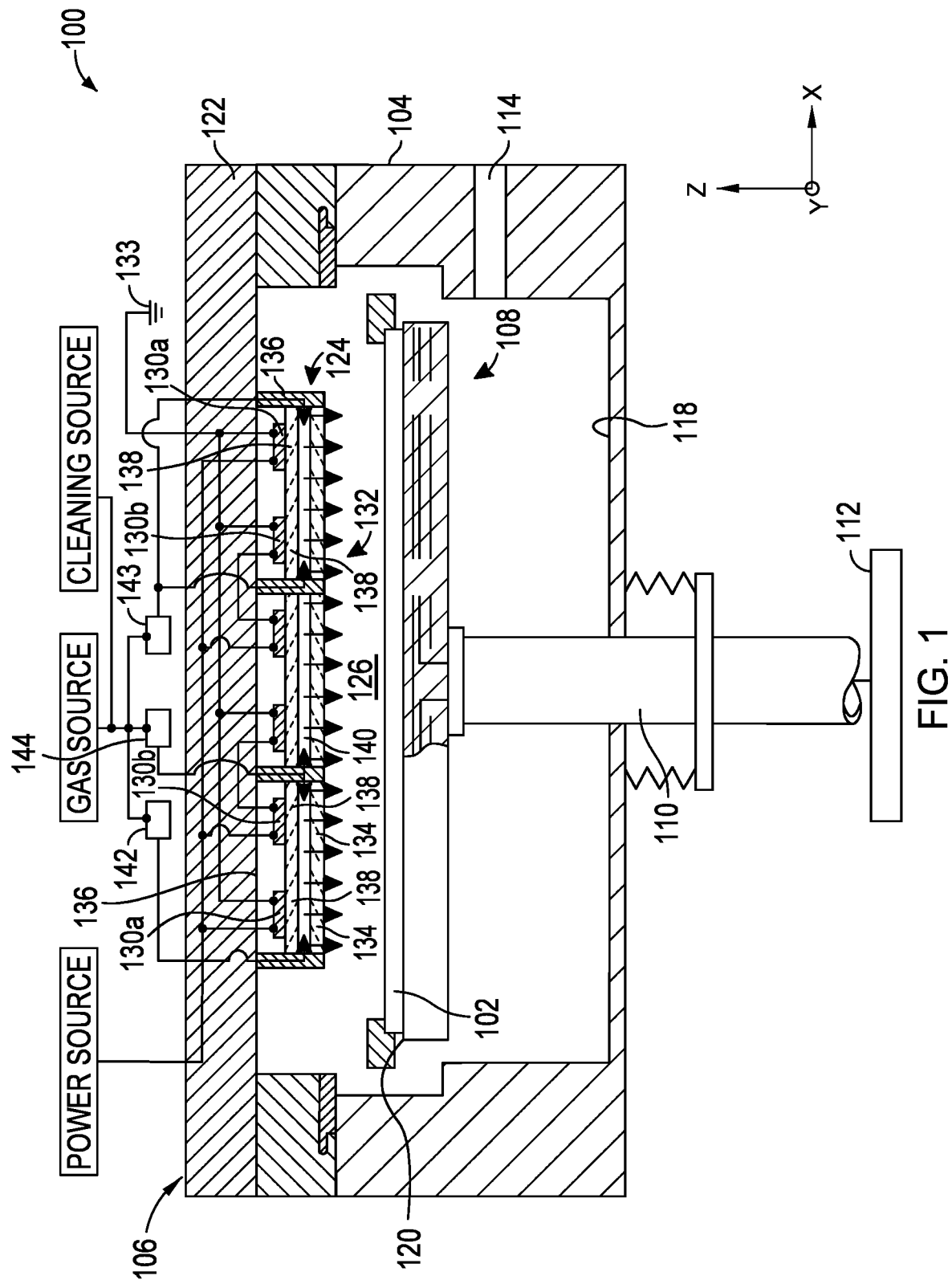
FIG. 1 is a schematic cross-sectional front view of a chamber according to an embodiment.

FIG. 1 is a schematic cross sectional side view of processing chamber 100, according to one embodiment of the present disclosure. An exemplary substrate 102 is shown on a substrate surface 120 within a chamber body 104. The substrate 102 may be, for example, a large area substrate having a surface area great than 1 square meter. The processing chamber 100 also includes a lid assembly 106, a bottom 118 disposed opposite the lid assembly 106, and a pedestal or substrate support assembly 108 disposed between the lid assembly 106 and the bottom 118. The lid assembly 106 is disposed at an upper end of the chamber body 104, and the substrate support assembly 108 is at least partially disposed within the chamber body 104. The substrate support assembly 108 is coupled to a shaft 110. The shaft 110 is coupled to a drive 112 that moves the substrate support assembly 108 vertically (in the Z direction) within the chamber body 104. The substrate support assembly 108 of the processing chamber 100 shown in FIG. 1 is in a processing position. However, the substrate support assembly 108 may be lowered in the Z direction to a position adjacent to a transfer port 114.

The lid assembly 106 includes a backing plate 122 that rests on the chamber body 104. The lid assembly 106 also includes a gas distribution assembly or showerhead 124. The showerhead 124 delivers process gases from a gas source to a processing region 126 between the showerhead 124 and the substrate 102. The showerhead 124 is also coupled to a cleaning gas source that provides cleaning gases, such as fluorine, chlorine, or oxygen containing gases, to the processing region 126.

The showerhead 124 also functions as a plasma source. To function as the plasma source, the showerhead 124 includes one or more inductively coupled plasma generating components, or inductive couplers 130a, 130b (e.g., antennas or coils). Each of the one or more inductive couplers 130a, 130b are coupled across a power source and ground 133. Although FIG. 1 depicts each of the inductive couplers 130a, 130b connected to the power source and ground 133 in parallel to facilitate control and tunability, a connection in series is also contemplated. In some embodiments, ground 133 is a capacitor or grounded through a capacitor. The showerhead 124 also includes a face plate 132 that comprises a plurality of discrete perforated tiles 134. The power source includes a match circuit or a tuning capability for adjusting electrical characteristics of the inductive couplers.

Each of the perforated tiles 134 are supported by a plurality of support members 136. Each of the one or more inductive couplers 130a, 130b or portions of the one or more inductive couplers are positioned on or over a respective dielectric window 138. A plurality of gas volumes 140 (three are shown) are defined by surfaces of the dielectric windows 138, the perforated tiles 134 and the support members 136. Each of the one or more inductive couplers 130a,b is configured to create an electromagnetic field that energizes the process gases into a plasma as gas is flowing into the gas volumes 140 and into the chamber volume therebelow through the adjacent perforated tile 134. In some embodiments which may be combined with other embodiments, process gases from the gas source are provided to each of the gas volumes 140 via conduits in the support members 136. The volume or flow rate of gas(es) entering and leaving the showerhead are controlled in different zones of the showerhead 124. Zone control of processing gases is provided by a plurality of flow controllers, such as mass flow controllers 142, 143 and 144 illustrated in FIG. 1. When chamber cleaning is required, cleaning gases from a cleaning gas source is flowed to each of the gas volumes 140 and thence into the processing volume 140 within which the cleaning gases are energized into ions, radicals, or both. The energized cleaning gases flow through the perforated tiles 134 and into the processing region 126 in order to clean chamber components.

Figure 2:
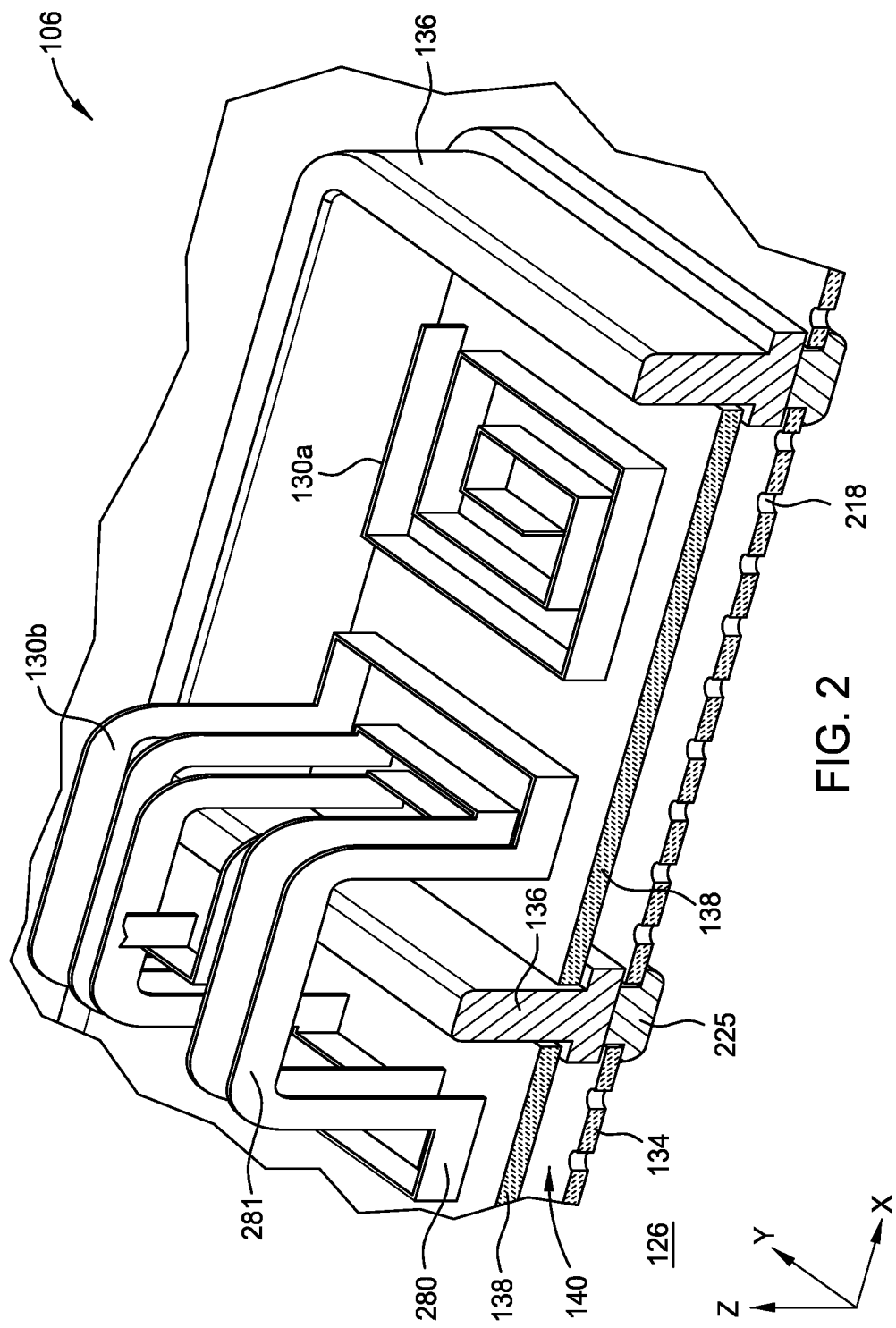
FIG. 2 is a cross-sectional perspective side view of a portion of a lid assembly according to an embodiment.

FIG. 2 is an enlarged cross-sectional side view of a portion of the lid assembly 106 of FIG. 1. The perforated tiles 134 include a plurality of openings 218 extending therethrough. Each of the plurality of openings 218 allow gases to flow from the gas volumes 140 into the processing region 126, at predetermined flow rates due to the diameter of the openings 218. A mounting portion 225 surrounds the sides of adjacent perforated tiles 134 at an interface of adjacent perforated tiles 134. The mounting portion 225 includes a ledge or shelf that supports a portion of the perimeter or an edge of the perforated tiles 134. The mounting portion 225 is fastened to support members 136 by a fastener, such as a bolt or screw. Each support member 136 includes a ledge or shelf that supports a portion of the perimeter or an edge of the dielectric window 138.

The use of the multiple dielectric windows 138 provides a physical barrier between the gas volume 140 and processing region 126, without imposing large stresses on the windows which would otherwise occur if fewer/larger dielectric windows were utilized. In some embodiments, during processing, the gas volumes 140 have a pressure of about 10 mTorr to about 3 Torr.

Materials for the showerhead 124 are chosen based on one or more of electrical characteristics, strength and chemical stability. The inductive couplers are made of an electrically conductive material, such as copper or aluminum. The backing plate 122 and the support members 136 are made of a material that is able to support the weight of the supported components and atmospheric pressure load, which may include a metal or other similar material, such as aluminum or aluminum alloy, or steel. The backing plate 122 and the support members 136 can be made of a non-magnetic material (e.g., non-paramagnetic or non-ferromagnetic material), such as aluminum or an alloy thereof. The perforated tiles 134 are made of a ceramic material, such as quartz, alumina or other similar material. The dielectric windows 138 are made of a quartz, alumina or sapphire. In some embodiments which may be combined with other embodiments, the dielectric windows 138 include copper, silver, aluminum, tungsten, molybdenum, titanium, combinations thereof, or alloys thereof.

The lid assembly 106 includes two different inductive couplers 130a, and 130b. The inductive couplers 130a are planar coils (e.g., a spiral coil disposed in a plane) and positioned entirely above a single dielectric window 138. The inductive couplers 130b are bridged coils (e.g., non-planar coils) which include a lower portion 280 and a bridge 281. The bridge 281 is disposed over a respective support member 136 such the inductive coupler 130b is positioned above adjacent dielectric windows 138. In one example, the footprint of the inductive coupler 130a is about half the footprint of the inductive couple 130b, such as about 70 percent to about 30 percent, for example about 60 percent to about 40 percent or about 55 percent to about 45 percent. In another embodiment, which can be combined with embodiments herein, it is contemplated that inductive coupler 130a may have a bridged configuration similar to the inductive coupler 130b, even though the inductive coupler 130a does not span a support member 136. In such a configuration, the inductive coupler 130a still has a reduced footprint relative to the inductive coupler 130b.

Figure 3A:
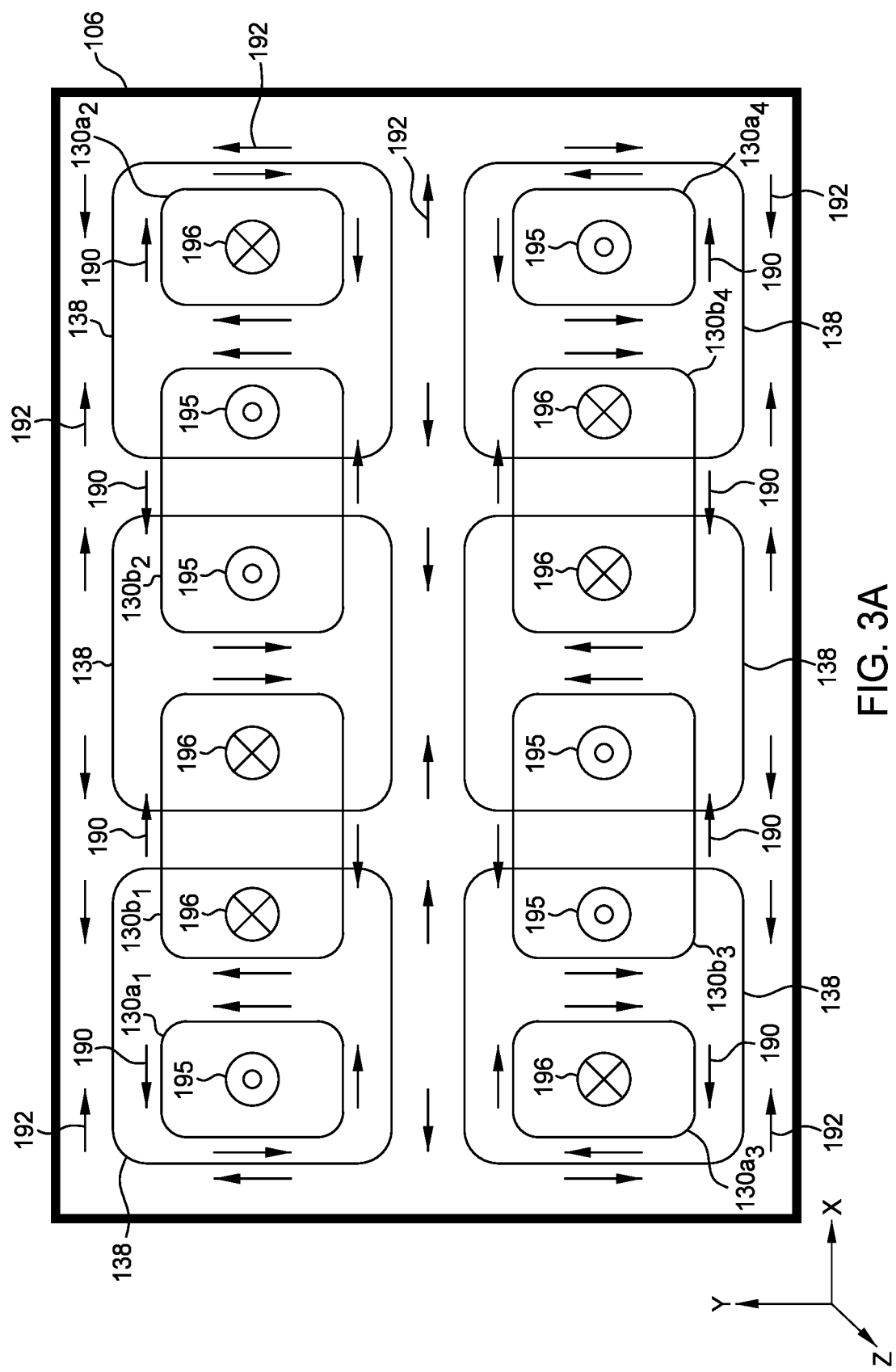
FIGS. 3A and 3B illustrate a schematic plan view of an inductive coupler arrangement of a lid according to one embodiment.
Figure 3B:
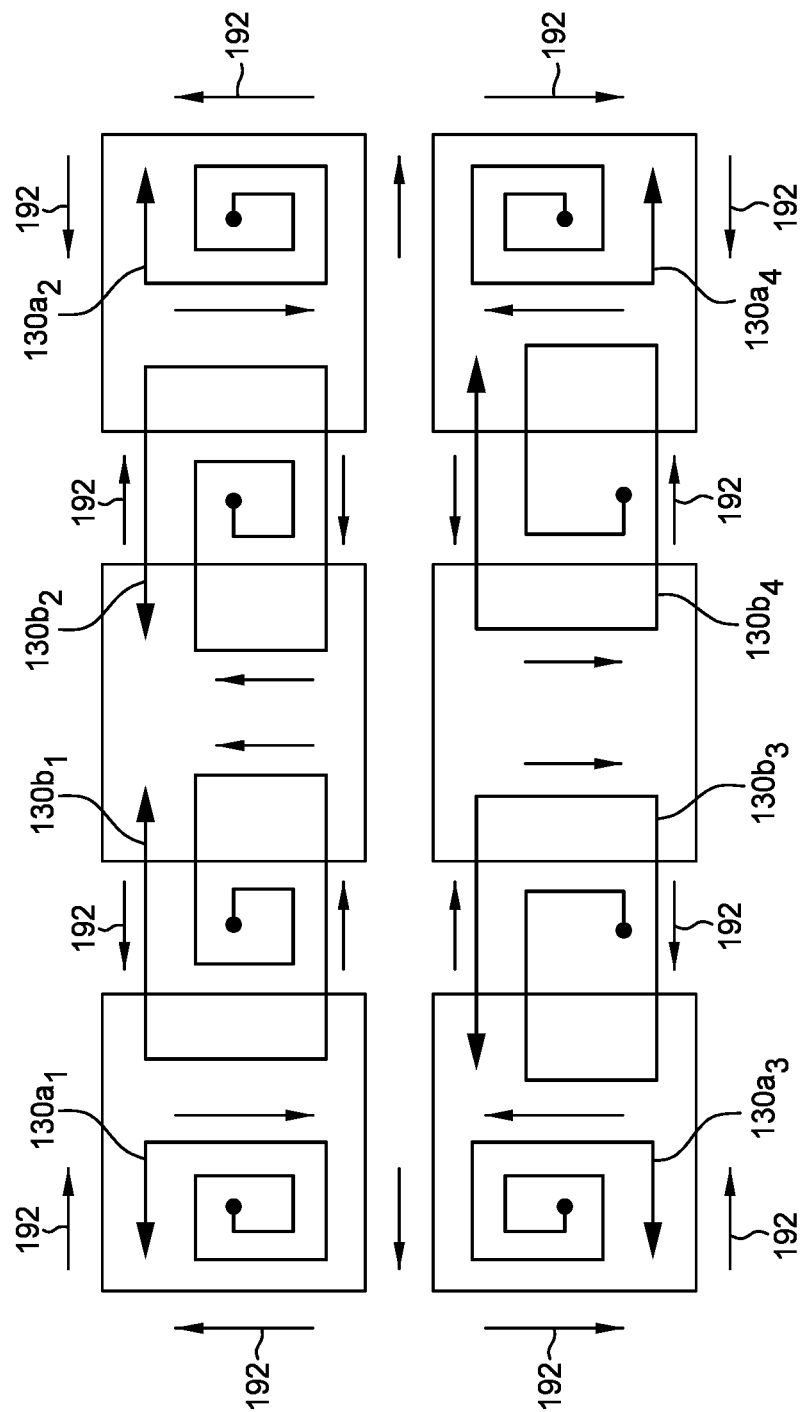

FIGS. 3A and 3B illustrate a schematic plan view of an inductive coupler arrangement of a lid 106 according to one embodiment. The lid 106 includes a plurality of dielectric windows 138 (six are shown) in a 2×3 array, and a plurality of inductive couplers 130a (four are shown) and inductive couplers 130b (four are shown). To facilitate explanation, inductive couplers 130a are individually labeled $130a_1$-$130a_4$ (collectively reference to 130a), and similarly, inductive couplers 130b are individually labeled $130b_1$-$130b_4$ (collectively referred to as 130b).

Each of the inductive couplers 130a are positioned adjacent laterally outward edges of the lid 106 and entirely over a single respective dielectric window 138. Each of the inductive couplers 130b are positioned inward of the inductive couplers 130a. Each inductive coupler 130b is positioned over two dielectric windows. In the illustrated configuration, each inductive coupler 130a also (partially) shares a dielectric window 138 with inductive coupler 130b. Similarly, each inductive coupler 130b also shares a dielectric window with another inductive coupler 130b.

With reference to both FIGS. 3A and 3B, the inductive couplers 130a and inductive couplers 130b are positioned such that adjacent inductive couplers generate magnetic fields in opposite directions. For example, inductive couplers $130a_1$, $130b_2$, $130b_3$, and $130a_4$ all generate magnetic fields which extend in the z-direction (e.g., out of plane of the page and denoted by symbol 195), while inductive couplers $130b_1$, $130a_2$, $130a_3$, and $130b_4$ all generate magnetic fields which extend in the negative z-direction (e.g. into the page and denoted by symbol 196). Arrows 190 of each inductive coupler 130a, 130b are illustrated to show the direction of current flow at the time of processing, which generates a corresponding magnetic field according to the "right hand rule."

As a result of current provided to each inductive coupler 130a, 130b, and the magnetic field generated thereby, eddy currents, indicated by arrows 192, are generated with the lid 106 of the process chamber. In conventional systems, generated eddy currents result in plasma non-uniformities, particularly at the edges of the lid 106 and/or at a center of the lid 106 due to inductive coupler arrangement relative to a respective support member 136 of each dielectric window 138 (which tends to accumulate eddy currents). However, the inductive coupler arrangement of the present disclosure effectively reduces eddy currents within the lid 106 due to the positioning thereof relative to the support members 136 at the dielectric window 138 perimeter. In particular, the inductive couplers 130a, 130b are positioned such that eddy currents generated around each dielectric window 138 (and the support members 136 surround each dielectric window 138) are in opposite directions, and thus substantially cancel one another out. To accomplish this, each dielectric window includes thereover at least portions of multiple (e.g., two) inductive couplers, which generate magnetic fields in opposite directions. The generation of magnetic fields in opposite directions results in eddy currents in opposite directions which cancel one another out. Because the eddy currents are cancelled out, eddy current effects on the plasma are reduced, and thus, plasma uniformity is increased.

Figure 4:
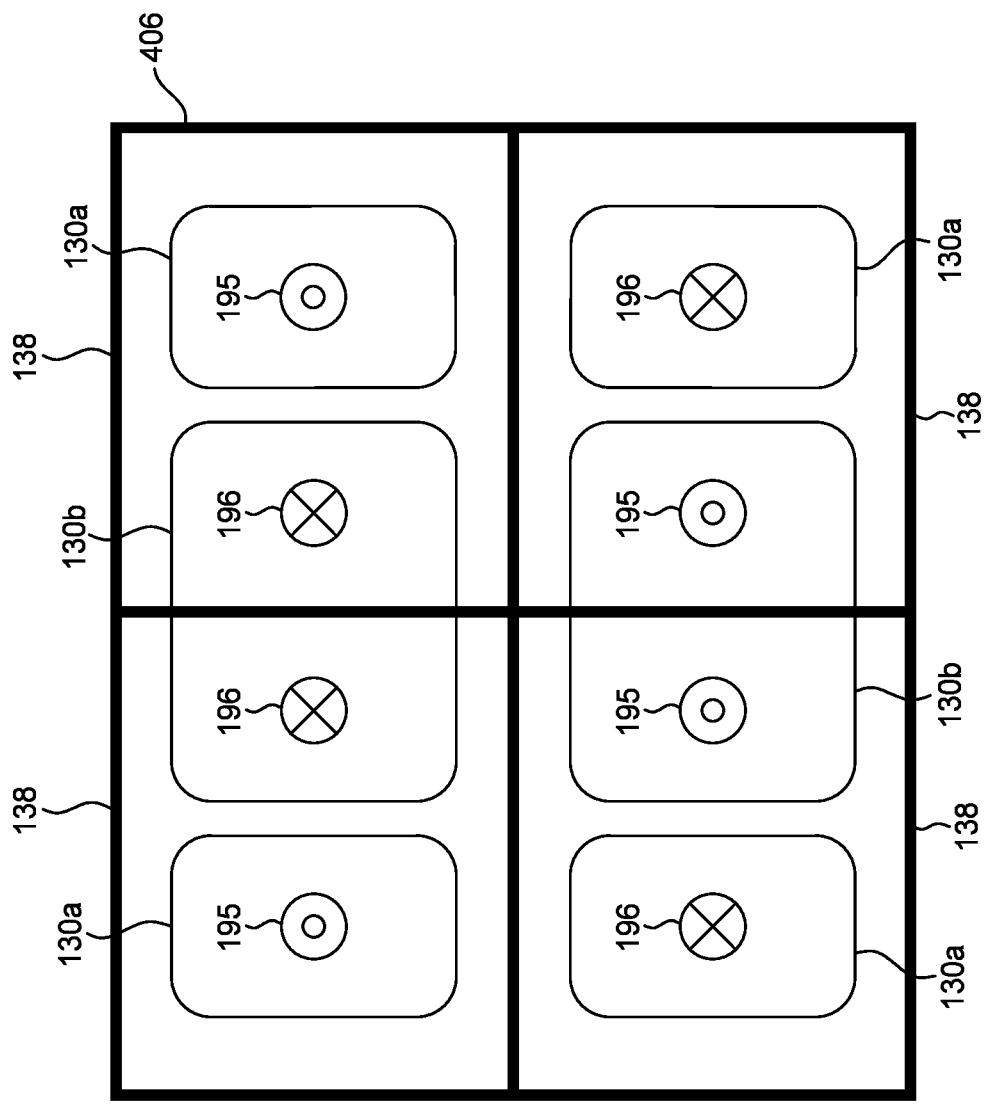
FIG. 4 illustrates a schematic plan view of an inductive coupler arrangement of a lid according to another embodiment.

FIG. 4 illustrates a schematic plan view of an inductive coupler arrangement of a lid 406 according to another embodiment. The lid 406 is similar to the lid 106, but includes four dielectric windows 138. Each dielectric window 138 has positioned thereover two (or portions thereof) inductive couplers, each of which generating magnetic fields in opposite directions. For example, each dielectric window 138 includes an inductive coupler 130a thereover, as well as a portion of an inductive coupler 130b thereover. The magnetic field directions of each respective inductive coupler 130a, 130b are illustrated by symbols 195, 196. The magnetic field directions indicated by symbols 195, 196 result in a reduction of eddy currents, improving plasma uniformity.

Figure 5:
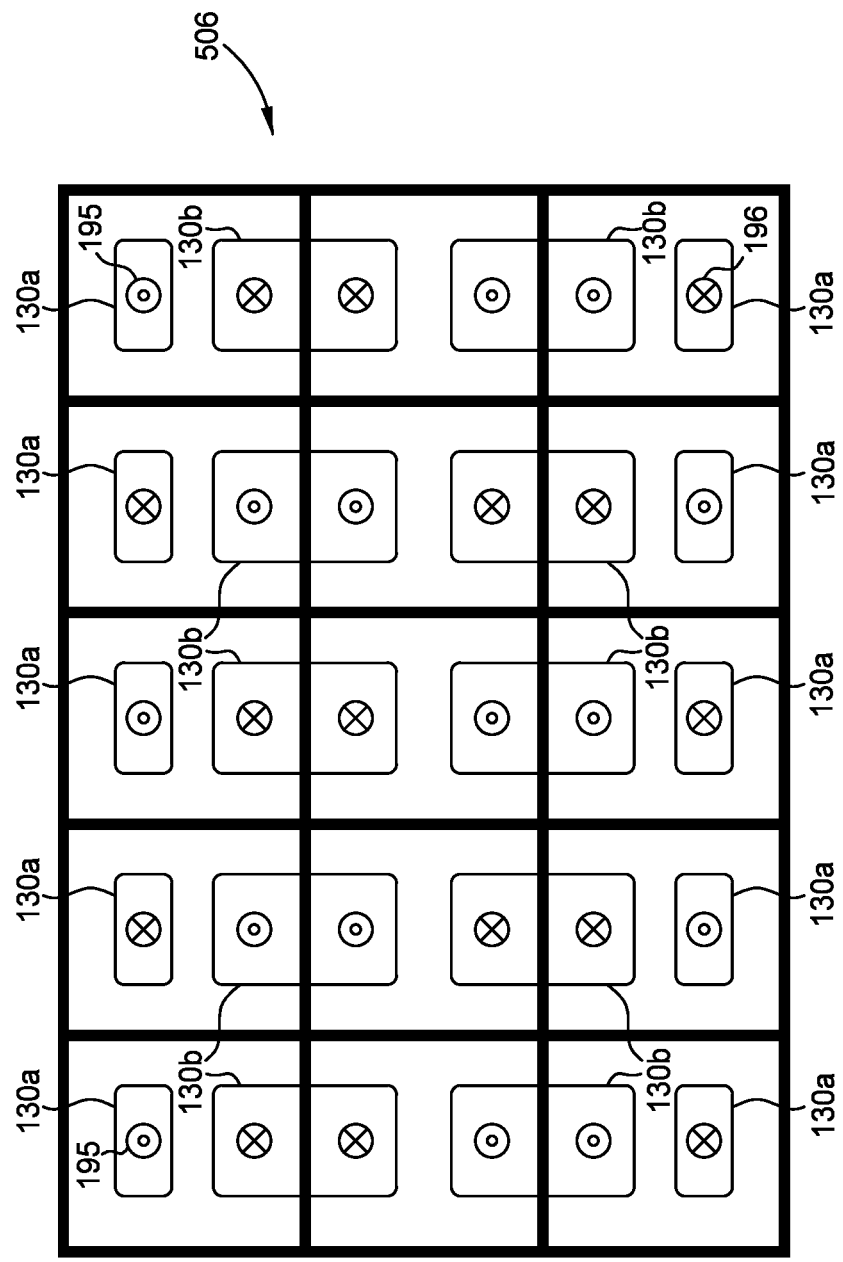
FIG. 5 illustrates a schematic plan view of an inductive coupler arrangement of a lid according to another embodiment.

FIG. 5 illustrates a schematic plan view of an inductive coupler arrangement of a lid 506 according to another embodiment. The lid 506 is similar to the lid 406, but includes 15 dielectric windows 138 in a 3×5 array. Each dielectric window 138 has positioned thereover two (or portions thereof) inductive couplers, each of which generating magnetic fields in opposite directions. For example, each dielectric window 138 includes an inductive coupler 130a thereover, as well as a portion of an inductive coupler 130b thereover. The magnetic field directions of each respective inductive coupler 130a, 130b are illustrated by symbols 195, 196. The magnetic field directions indicated by symbols 195, 196 result in a reduction of eddy currents, improving plasma uniformity. As illustrated by the lid 506, the inductive couplers 130a, 130b can be arranged in different orientations, and can be scaled to accommodate arrays of desired dimensions.

Figure 6:
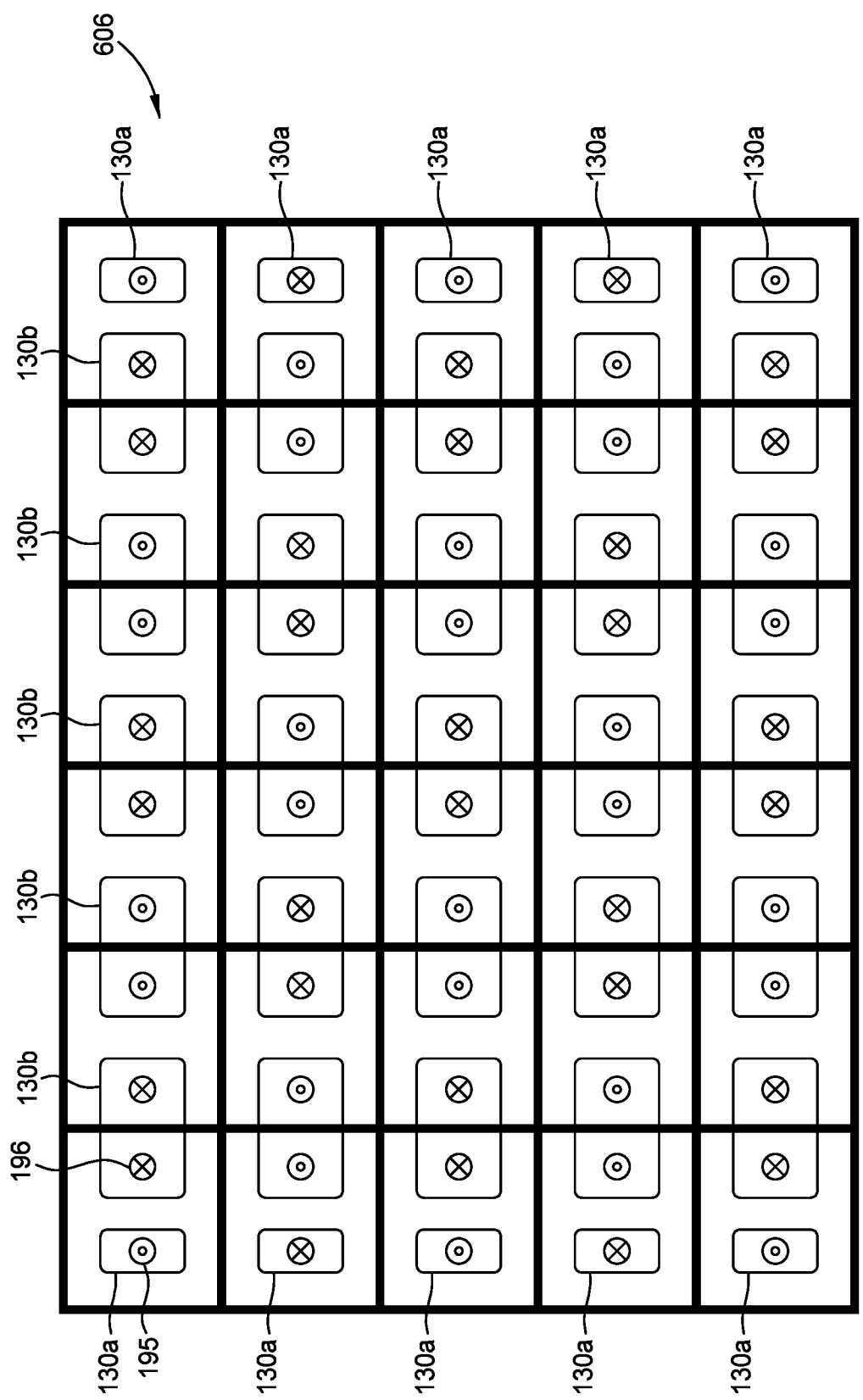
FIG. 6 illustrates a schematic plan view of an inductive coupler arrangement of a lid according to another embodiment.

FIG. 6 illustrates a schematic plan view of an inductive coupler arrangement of a lid 606 according to another embodiment. The lid 606 is similar to the lid 506, but includes 30 dielectric windows 138 in a 5×6 array. Each dielectric window 138 has positioned thereover two (or portions thereof) inductive couplers, each of which generating magnetic fields in opposite directions. For example, each dielectric window 138 along the laterally outward edges includes an inductive coupler 130a thereover, as well as a portion of an inductive coupler 130b thereover. Interior dielectric windows 138 include a portion of a first inductive coupler 130b and a portion of a second inductive coupler 130b thereover. The magnetic field directions of each respective inductive coupler 130a, 130b are illustrated by symbols 195, 196. The magnetic field directions indicated by symbols 195, 196 result in a reduction of eddy currents, improving plasma uniformity. As illustrated by the lid 606, the inductive couplers 130a, 130b can be arranged in different orientations, and can be scaled to accommodate arrays of desired dimensions.

Aspects of the present disclosure provide for reduced eddy current effects during processing, thus improving plasma uniformity and increasing average plasma density since the effect of eddy currents on the plasma is reduced. In addition, the reduction of eddy currents provided by the disclosed embodiments also reduces undesired and/or adverse effects on chamber components which otherwise in occur in conventional ICP chambers. For example, the reduction in eddy currents in support members surrounding dielectric windows—particularly those adjacent chamber components such as the chamber wall or body—results in less likelihood of arcing occurring between the support member and the adjacent chamber component. The reducing in arcing improves hardware longevity and reduces particle contamination. Moreover, the reduction in eddy currents facilitates improvements in RF power loss and temperature uniformity within the process chamber (thus promoting process uniformity), and also reduces the cooling requirements of the process chamber. For example, due to the reduced eddy currents in the support members, resistive heating of the support members is reduced, lowering the cooling requirements of the process chamber and facilitating temperature uniformity.

While the foregoing is directed to embodiments of the present disclosure, other and further embodiments of the disclosure may be devised without departing from the basic scope thereof, and the scope thereof is determined by the claims that follow.

What is claimed is:

1. A lid suitable for use in a semiconductor processing chamber, comprising:
   a plurality of dielectric windows coupled to a perforated faceplate;
   a plurality of support members coupled to the perforated faceplate and positioned between adjacent dielectric windows; and
   a plurality inductive couplers positioned adjacent the dielectric window;
   wherein each dielectric window of the plurality of dielectric windows has at least a portion of two of the inductive couplers of the plurality of the inductive couplers positioned thereover.

2. The lid of claim 1, wherein a first portion of the at least a portion of the two of the inductive couplers is configured to generate a magnetic field in a first direction, and a second portion of the at least a portion of the two of the inductive couplers is configured to generate a magnetic field in a second direction.

3. The lid of claim 1, wherein the plurality of inductive couplers comprises a first subset of inductive couplers and a second subset of inductive couplers, and each inductive coupler of the first subset of inductive couplers comprises:
   a first lower portion;
   a second lower portion; and
   a bridge.

4. The lid of claim 3, wherein the bridge is disposed over at least one of the plurality of support members.

5. The lid of claim 3, wherein each inductive coupler of the second subset of inductive couplers is planar.

6. The lid of claim 1, further comprising a power source and a ground, wherein each inductive coupler of the plurality of inductive couplers is connected to the power source and the ground.

7. A lid suitable for use in a semiconductor processing chamber, comprising:
   a plurality of dielectric windows coupled to a perforated faceplate;
   a plurality of support members coupled to the perforated faceplate and positioned between adjacent dielectric windows; and
   a plurality inductive couplers comprising a first subset of inductive couplers and a second subset of inductive couplers, wherein:
   each inductive coupler of the first subset of inductive couplers comprises:
      a first lower portion;
      a second lower portion; and
      a bridge;
   the bridge is disposed over at least one of the plurality of support members,
   the first lower portion is positioned on a first dielectric window of the plurality of dielectric windows,
   the second lower portion is positioned on a second dielectric window of the plurality of dielectric windows, and
   the second dielectric window is adjacent to the first dielectric window.

8. The lid of claim 7, wherein each inductive coupler of the second subset of inductive couplers is planar.

9. The lid of claim 8, wherein each inductive coupler of the second subset of inductive couplers is positioned entirely over a respective dielectric window of the plurality of dielectric windows.

10. The lid of claim 8, wherein each inductive coupler of the second subset of inductive couplers is a coiled electrode.

11. The lid of claim 8, wherein the second subset of inductive couplers are positioned adjacent laterally on an outward edge of the lid.

12. The lid of claim 7, wherein each dielectric window of the plurality of dielectric windows is connected to one of the first subset of inductive couplers and one of the second subset of inductive couplers.

13. The lid of claim 12, wherein the one of the first subset of inductive couplers is configured to generate a magnetic field in a first direction, and the one of the second subset of inductive couplers is configured to generate a magnetic field in a second direction.

14. The lid of claim 12, wherein the first direction is opposite the second direction.

15. The lid of claim 7, further comprising a power source and a ground, wherein each inductive coupler of the plurality of inductive couplers is connected to the power source and the ground.

16. A lid suitable for use in a semiconductor processing chamber, comprising:
   a plurality of dielectric windows coupled to a perforated faceplate, the plurality of dielectric windows comprising a first subset of dielectric windows and a second subset of dielectric windows;
   a plurality of support members coupled to the perforated faceplate and positioned between adjacent dielectric windows; and a plurality of inductive couplers comprising a first subset of inductive couplers and a second subset of inductive couplers, wherein:

the first subset of inductive couplers, are non-planar, the second subset of inductive couplers, are planar, the first subset of dielectric windows have a portion of two inductive couplers of the first subset of inductive couplers positioned thereon, and the second subset of dielectric windows have a portion of one inductive coupler of the first subset of inductive couplers and one inductive coupler of the second subset of inductive couplers positioned thereon.

17. The lid of claim 16, wherein the second subset of dielectric windows are positioned adjacent laterally on an outward edge of the lid.

18. The lid of claim 16, wherein the first subset of inductive couplers each comprises:

a first lower portion;

a second lower portion; and a bridge.

19. The lid of claim 18, wherein the bridge is disposed over at least one of the plurality of support members.

20. The lid of claim 16, wherein:

the portion of the two inductive couplers positioned on the first subset of dielectric windows generate a magnetic field in opposite directions; and the portion of the one inductive coupler of the first subset of inductive couplers and the one inductive coupler of the second subset of inductive couplers positioned on the second subset of dielectric windows generate a magnetic field in opposite directions.

* * * * *